(12) United States Patent
Tachi

(10) Patent No.: US 12,136,666 B2
(45) Date of Patent: Nov. 5, 2024

(54) SEMICONDUCTOR DEVICE HAVING A SWITCHING DEVICE

(71) Applicant: ROHM CO., LTD., Kyoto (JP)

(72) Inventor: Tsuyoshi Tachi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 247 days.

(21) Appl. No.: 17/675,679

(22) Filed: Feb. 18, 2022

(65) Prior Publication Data

US 2022/0302290 A1  Sep. 22, 2022

(30) Foreign Application Priority Data

Mar. 19, 2021 (JP) .................................. 2021-045490

(51) Int. Cl.
*H01L 29/778* (2006.01)
*H01L 23/48* (2006.01)

(52) U.S. Cl.
CPC ............ *H01L 29/778* (2013.01); *H01L 23/48* (2013.01)

(58) Field of Classification Search
None
See application file for complete search history.

(56) References Cited

U.S. PATENT DOCUMENTS

2018/0342438 A1* 11/2018 Chen ................. H01L 23/49568
2020/0312961 A1* 10/2020 Then ................... H01L 29/7786

FOREIGN PATENT DOCUMENTS

JP        2021027117 A      2/2021

* cited by examiner

*Primary Examiner* — Dale E Page
*Assistant Examiner* — Derek L Nielsen
(74) *Attorney, Agent, or Firm* — HSML P. C.

(57) ABSTRACT

The present disclosure provides a semiconductor device. The semiconductor device includes: a switching device, having a first device surface and a second device surface that face opposite to each other in a thickness direction, and a drain electrode, a source electrode and a gate electrode that are arranged on the first device surface; a first lead, conductively connected to the drain electrode; a second lead, conductively connected to the source electrode; a third lead, conductively connected to the gate electrode; and a resin portion, covering the switching device and a portion of each of the first to the third leads, and having a first resin surface facing the same side as the first device surface and a second resin surface facing the same side as the second device surface. The first to the third leads are exposed from the first resin surface.

20 Claims, 14 Drawing Sheets

SEMICONDUCTOR DEVICE HAVING A SWITCHING DEVICE

TECHNICAL FIELD

The present disclosure relates to a semiconductor device.

BACKGROUND

Various structures have been proposed for a semiconductor device having a semiconductor element represented by a transistor. Patent document 1 discloses an example of such conventional semiconductor device. The semiconductor device disclosed in the publication includes multiple leads, and a semiconductor element supported by the leads. The semiconductor element is connected to the leads via conducting wires.

PRIOR ART DOCUMENT

Patent Publication

[Patent document 1] Japan Patent Publication No. 2021-027117

SUMMARY OF THE PRESENT DISCLOSURE

Problems to be Solved by the Disclosure

In the semiconductor device of the publication, leads, a semiconductor element and conducting wires are arranged in a thickness direction of the leads. As a result, a dimension of the semiconductor device in the thickness direction is increased.

The present disclosure is developed with respect to the situation above, and aims to provide a semiconductor device capable of achieving thinning.

Technical Means for Solving the Problem

A semiconductor device provided by the present disclosure includes: a switching device, having a first device surface and a second device surface facing opposite to each other in a thickness direction, and a drain electrode, a source electrode and a gate electrode that are arranged on the first device surface; a first lead, conductively connected to the drain electrode; a second lead, conductively connected to the source electrode; a third lead, conductively connected to the gate electrode; and a resin portion, covering the switching device and a portion of each of the first to the third leads, and having a first resin surface facing a same side as the first device surface and a second resin surface facing a same side as the second device surface, wherein the first to the third leads are exposed from the first resin surface.

Effects of the Present Disclosure

Thinning of the semiconductor device can be achieved by the present disclosure.

Other features and advantages of the present disclosure will become more readily apparent with the detailed description given with the accompanying drawings below.

DETAILED DESCRIPTION OF THE EMBODIMENTS

Figure 1:
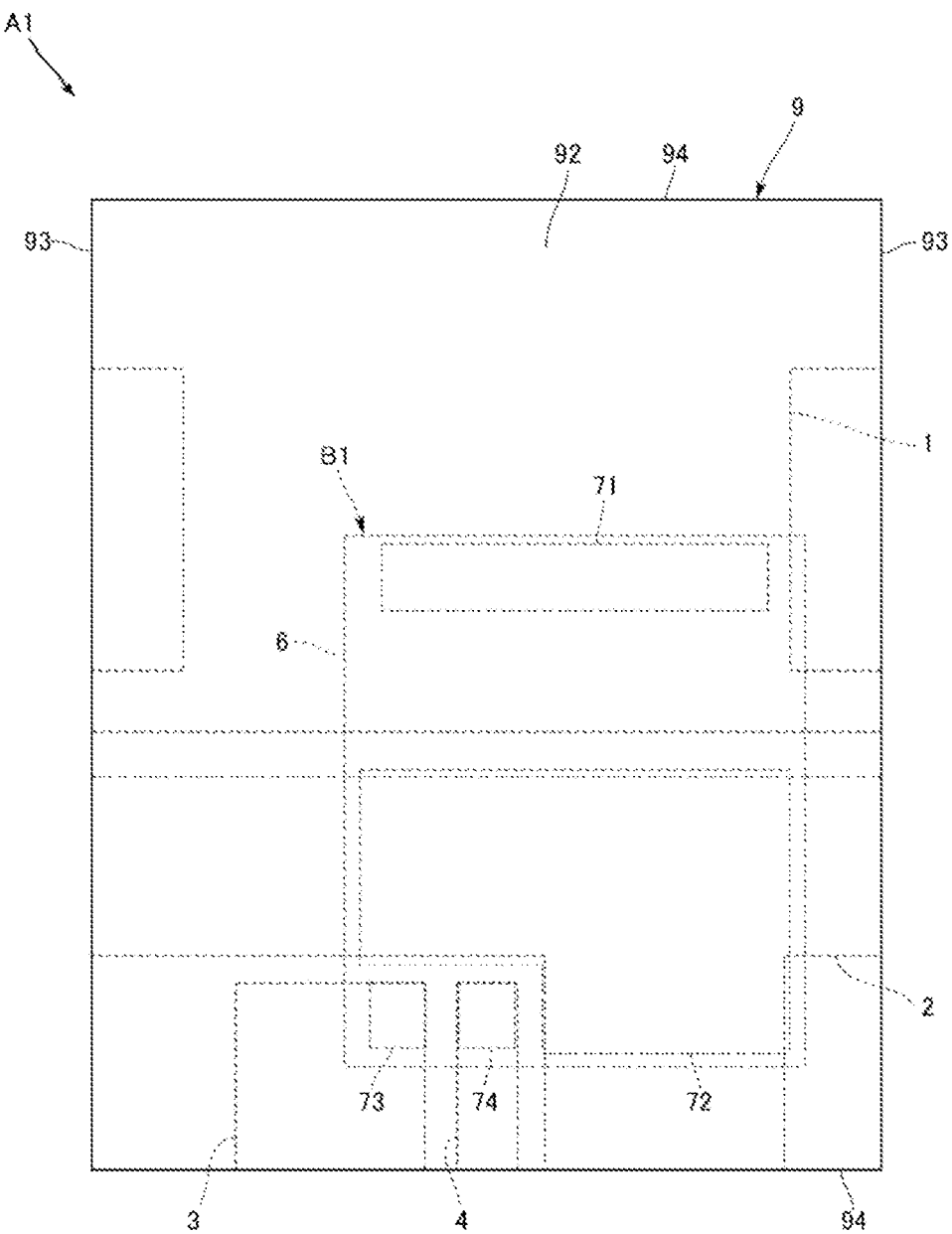
FIG. 1 is a top view of a semiconductor device according to a first embodiment of the present disclosure.

Details of the preferred embodiments of the present disclosure are specifically described with the accompanying drawings below.

The terms "first", "second" and "third" used in the present disclosure are for identification purposes, and are not to be construed as assigning orders to the targets.

First Embodiment

FIG. 1 to FIG. 11 show a semiconductor device according to a first embodiment of the present disclosure. A semiconductor device A1 of the embodiment includes a first lead 1, a second lead 2, a third lead 3, a fourth lead 4, a switching device B1 and a resin portion 9.

Figure 2:
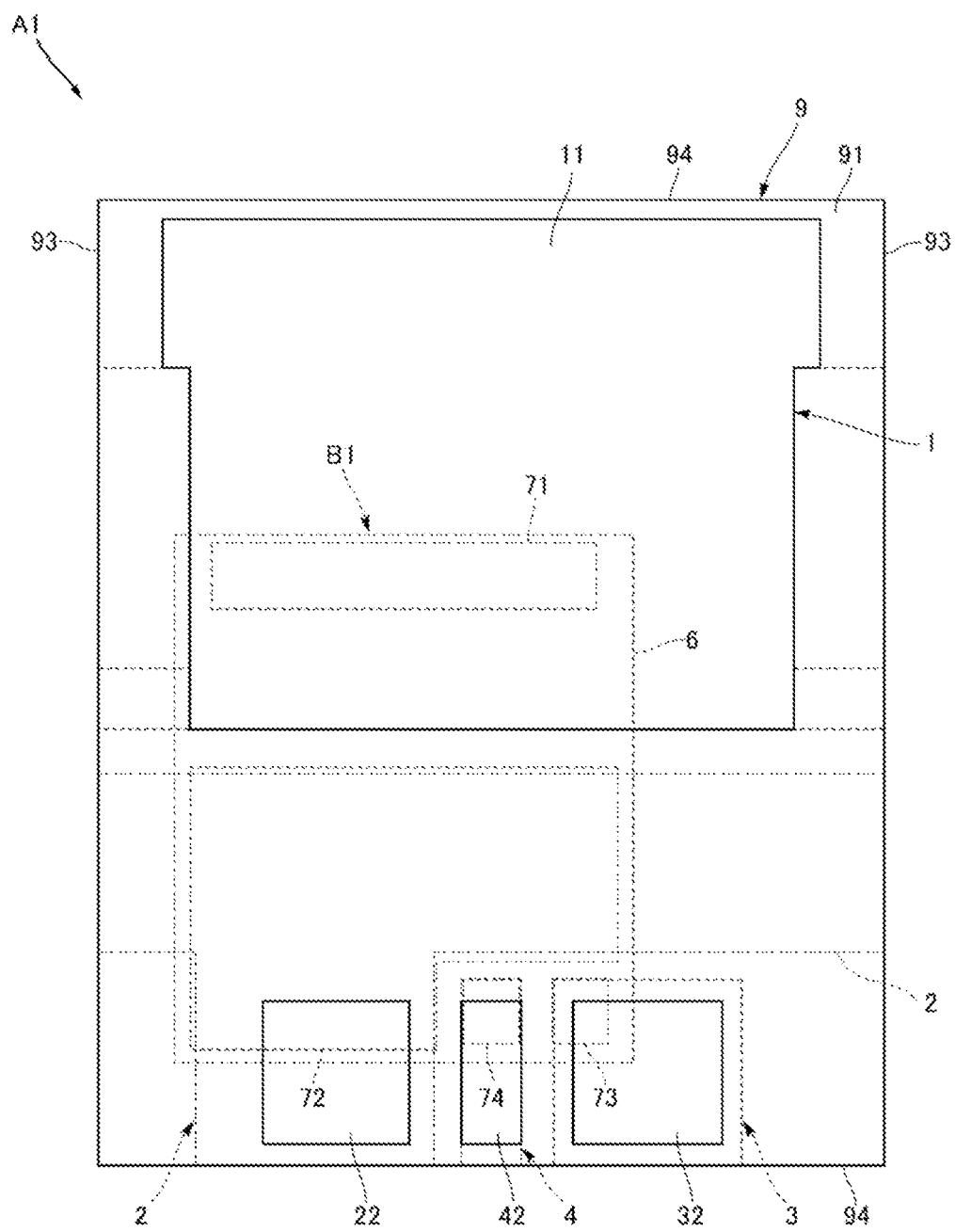
FIG. 2 is a bottom view of a semiconductor device according to the first embodiment of the present disclosure.
Figure 3:
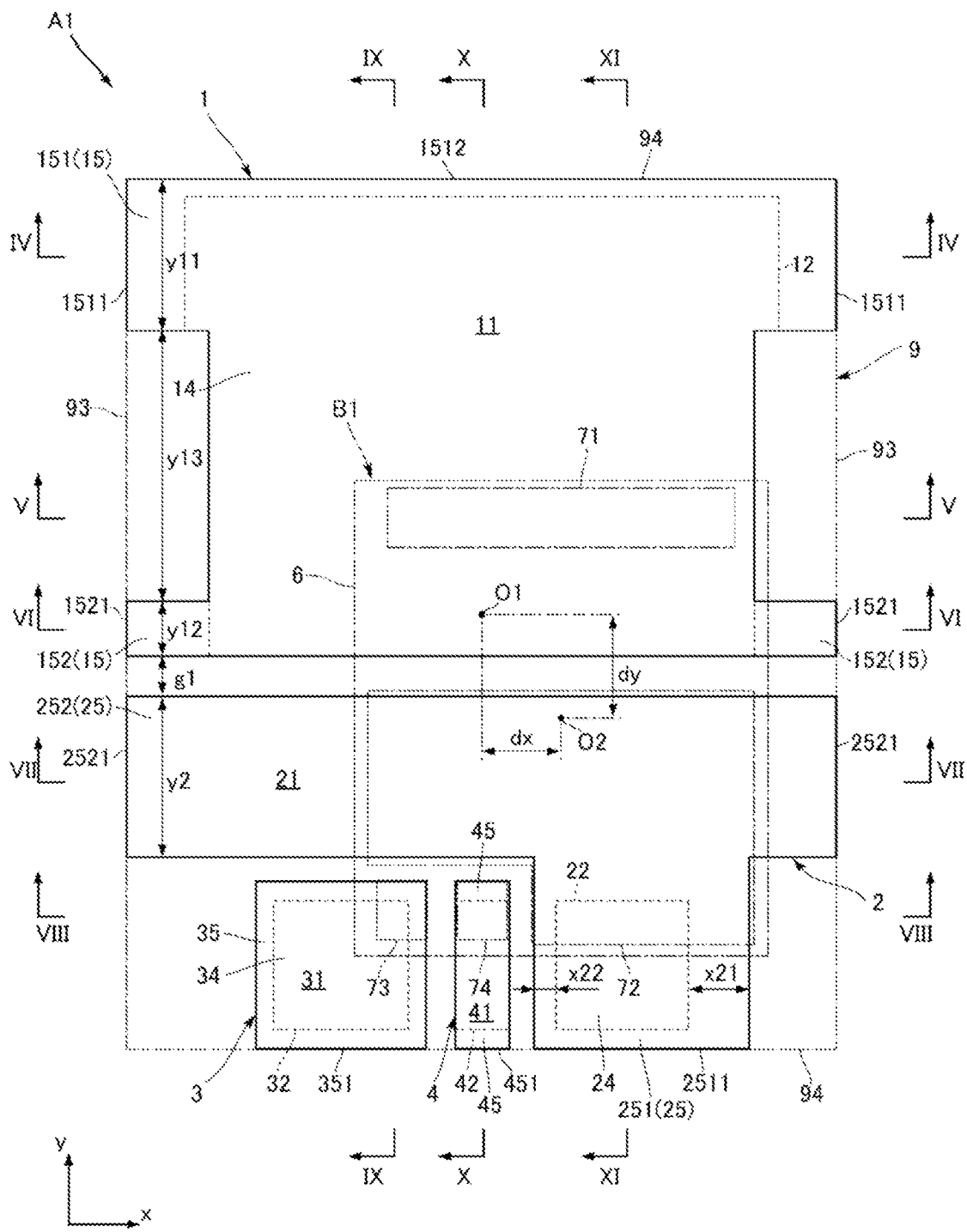
FIG. 3 is a top view of a main part of a semiconductor device according to the first embodiment of the present disclosure.
Figure 4:
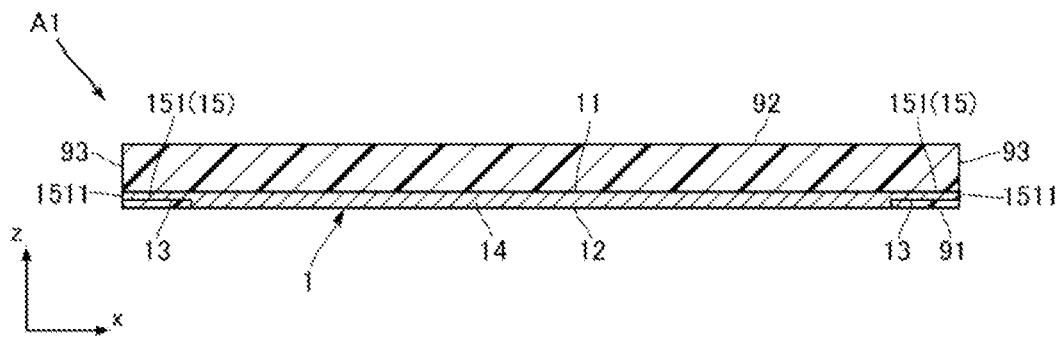
FIG. 4 is a sectional diagram along a section line IV-IV in FIG. 3.
Figure 5:
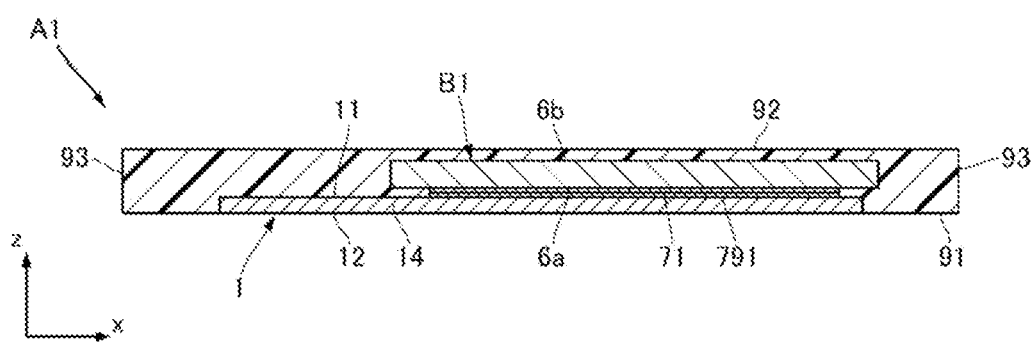
FIG. 5 is a sectional diagram along a section line V-V in FIG. 3.
Figure 6:
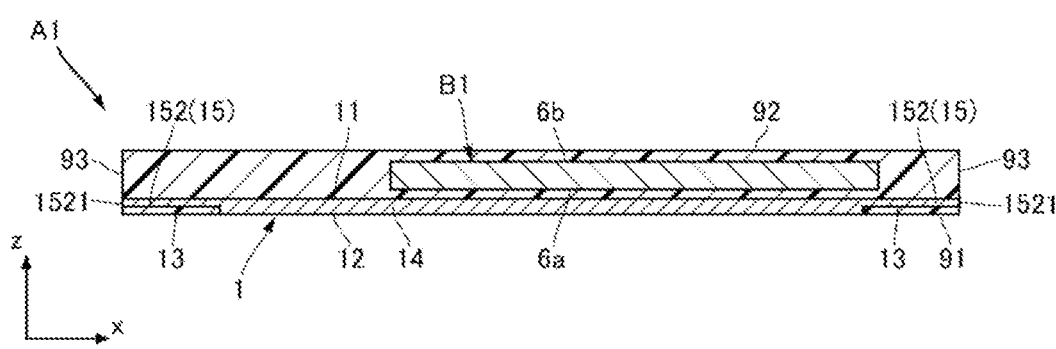
FIG. 6 is a sectional diagram along a section line VI-VI in FIG. 3.
Figure 7:
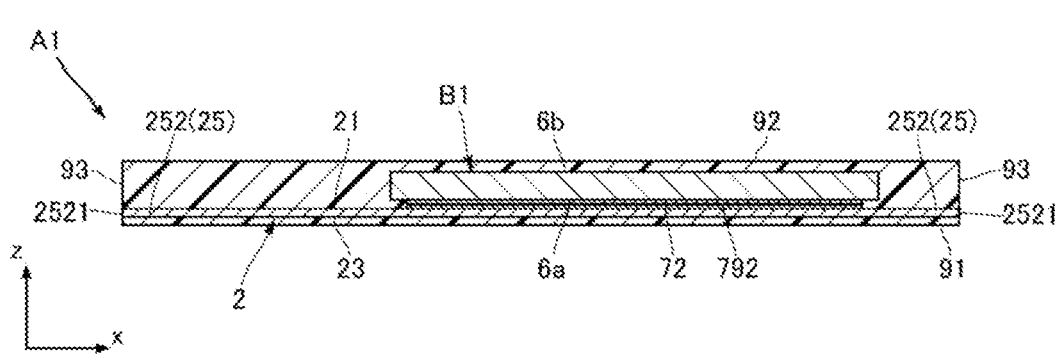
FIG. 7 is a sectional diagram along a section line VII-VII in FIG. 3.
Figure 8:
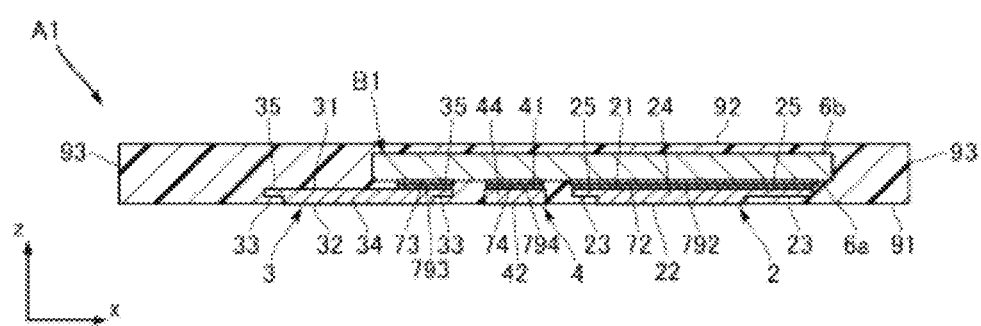
FIG. 8 is a sectional diagram along a section line VIII-VIII in FIG. 3.
Figure 9:
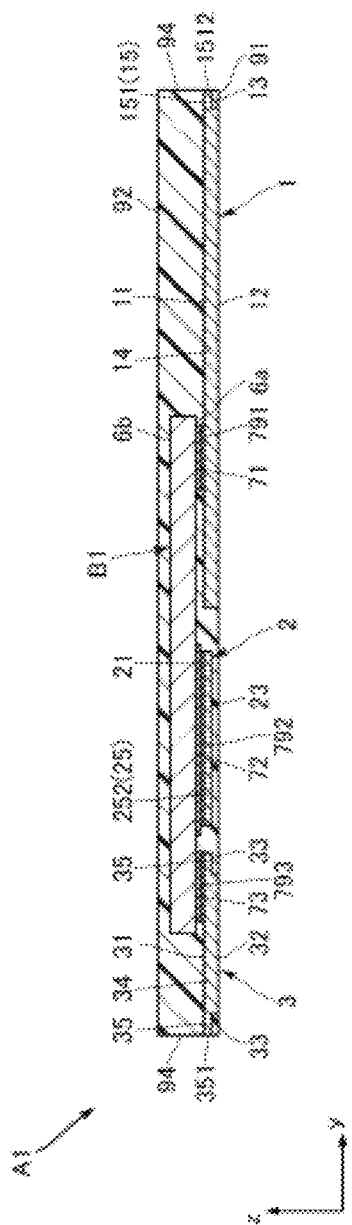
FIG. 9 is a sectional diagram along a section line IX-IX in FIG. 3.
Figure 10:
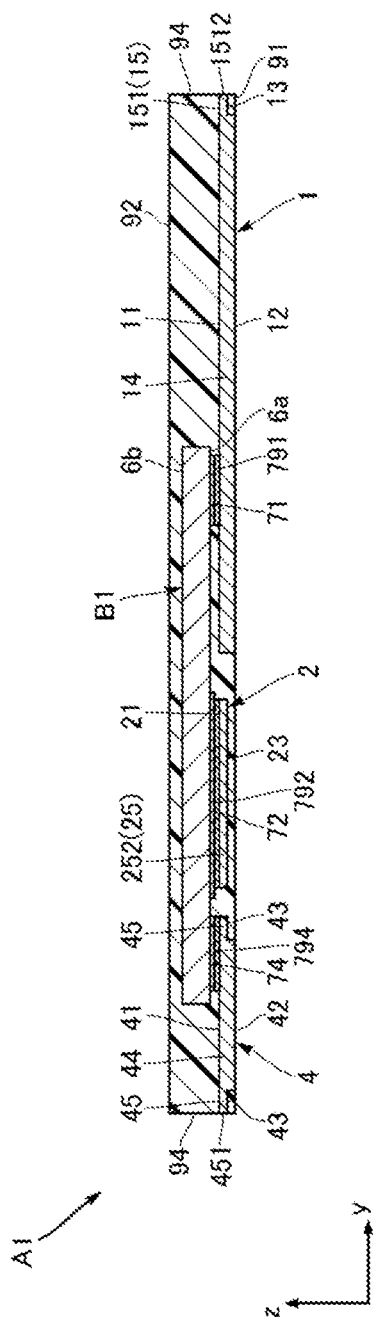
FIG. 10 is a sectional diagram along a section line X-X in FIG. 3.
Figure 11:
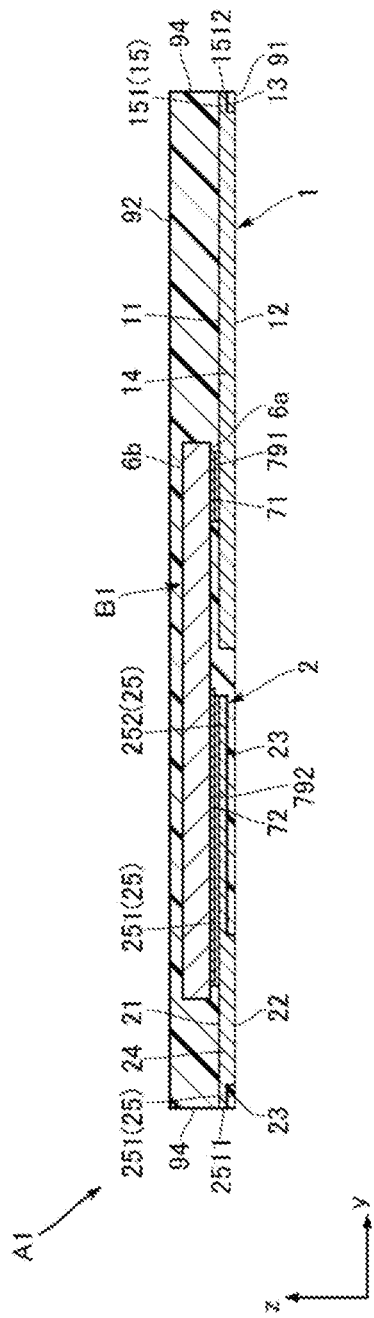
FIG. 11 is a sectional diagram along a section line XI-XI in FIG. 3.

FIG. 1 shows a top view of the semiconductor device A1. FIG. 2 shows a bottom view of the semiconductor device A1. FIG. 3 shows a top view of a main part of the semiconductor device A1. FIG. 4 shows a sectional diagram along a section line IV-IV in FIG. 3. FIG. 5 shows a section diagram along a section line V-V in FIG. 3. FIG. 6 shows a sectional diagram along a section line VI-VI in FIG. 3. FIG. 7 shows a sectional diagram along a section line VII-VII in FIG. 3. FIG. 8 shows a sectional diagram along a section line VIII-VIII in FIG. 3. FIG. 9 shows a sectional diagram along a section line IX-IX in FIG. 3. FIG. 10 shows a sectional diagram along a section line X-X in FIG. 3. FIG. 11 shows a sectional diagram along a section line XI-XI in FIG. 3. In FIG. 3, for better understanding, the switching device B1 and the resin portion 9 are indicated by imaginary lines. In these drawings, the z direction is equivalent to a thickness direction of the present disclosure, the y direction is equivalent to a first direction of the present disclosure, and the x direction is equivalent to a second direction of the present disclosure.

The semiconductor device A1 does not have a specifically defined shape, and appears rectangular from a view along the z direction in this embodiment. The semiconductor device A1 does not have specifically defined dimensions; in one example, a dimension in the x direction is approximately 10 mm to 15 mm, a dimension in the y direction is approximately 12 mm to 20 mm, and a dimension in the z direction is approximately 0.8 mm to 2.0 mm.

(Switching Device B1)

The switching device B1 is a device that performs switching on a main current by means of applying a control voltage. FIG. 12 to FIG. 17 show the switching device B1. The switching device B1 includes a semiconductor element 5, a sealing material 6, a drain electrode 71, a source electrode 72, a gate electrode 73, a source sensing electrode 74, intermediate wiring layers 811 to 814, and connecting portions 821 to 834.

Figure 12:
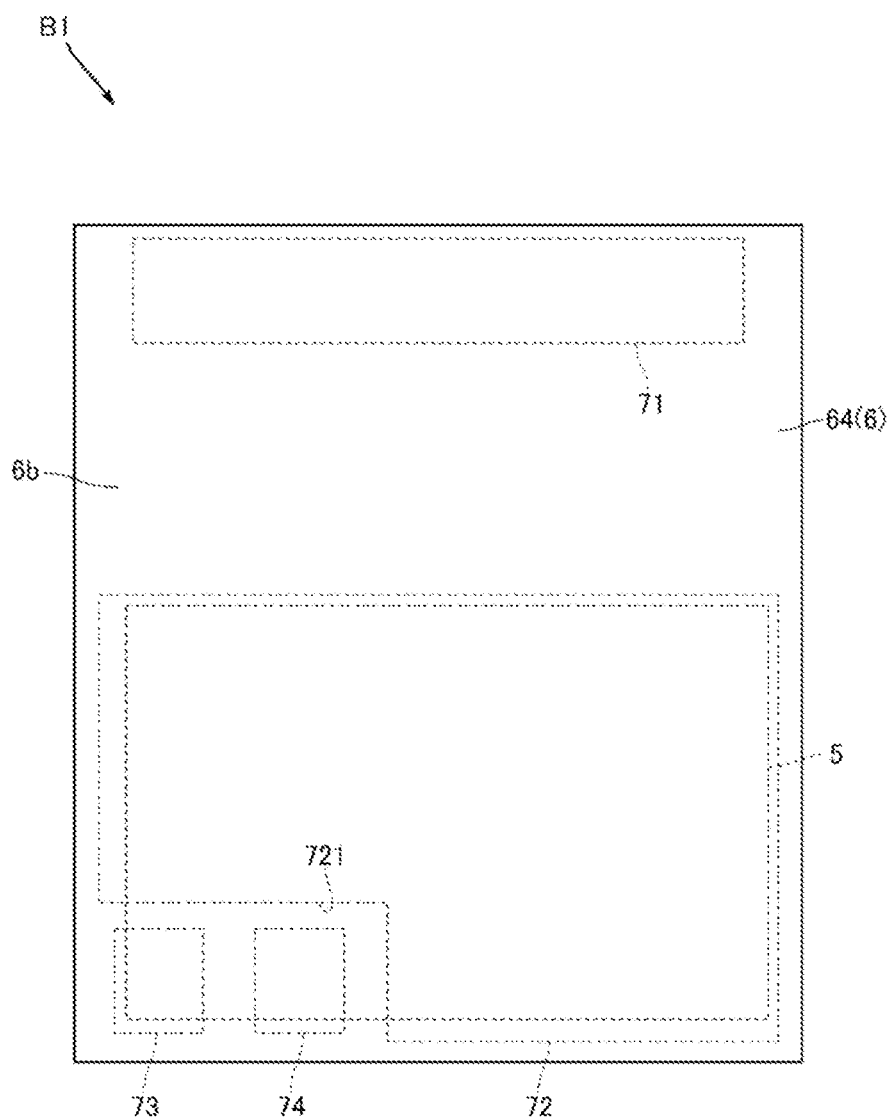
FIG. 12 is a top view of a switching device of a semiconductor device according to the first embodiment of the present disclosure.
Figure 13:
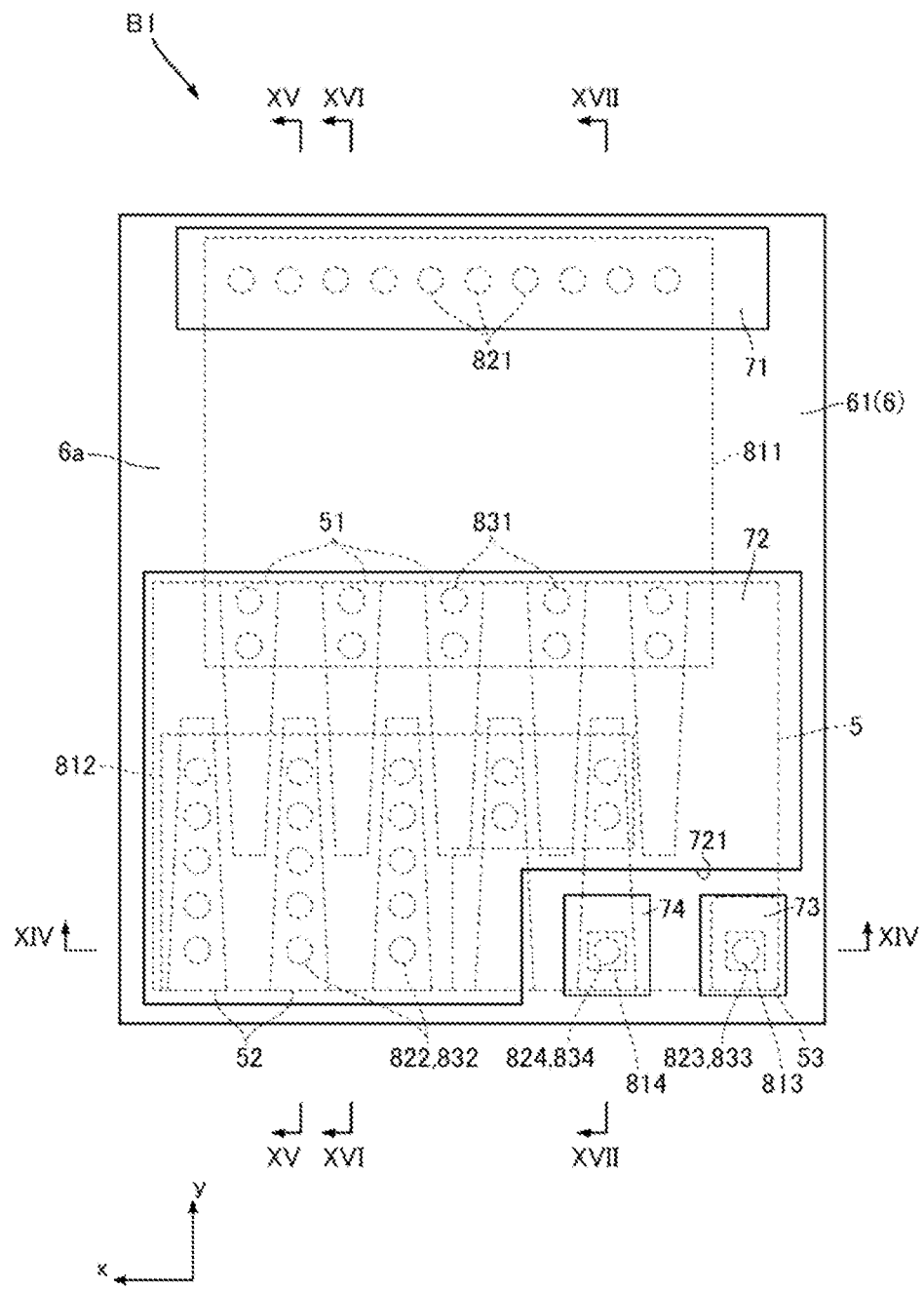
FIG. 13 is a bottom view of a switching device of a semiconductor device according to the first embodiment of the present disclosure.
Figure 14:
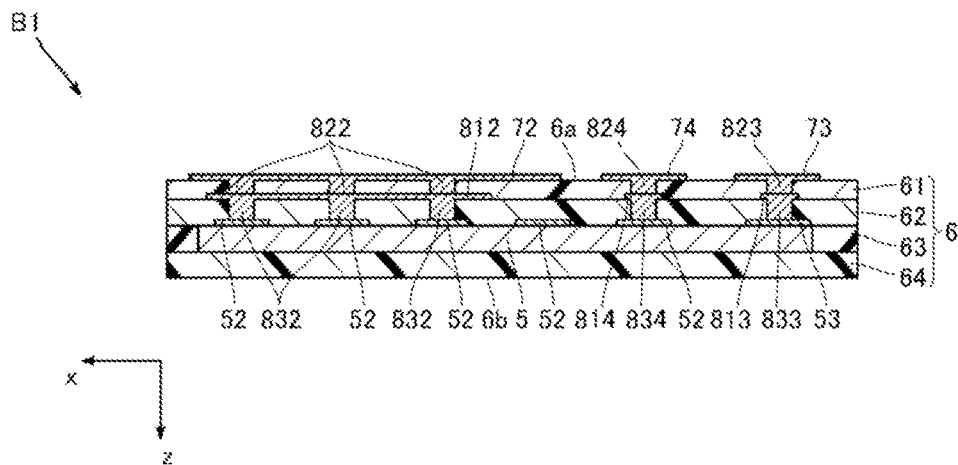
FIG. 14 is a sectional diagram along a section line XIV-XIV in FIG. 13.
Figure 15:
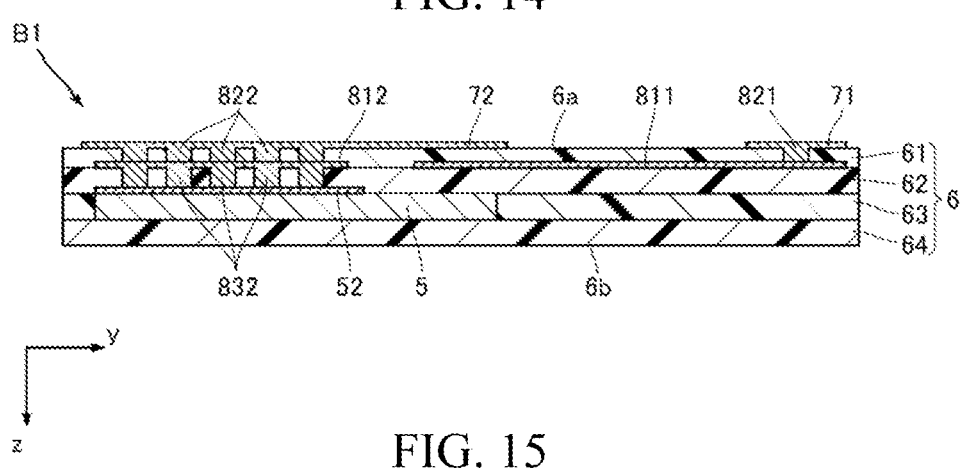
FIG. 15 is a sectional diagram along a section line XV-XV in FIG. 13.
Figure 16:
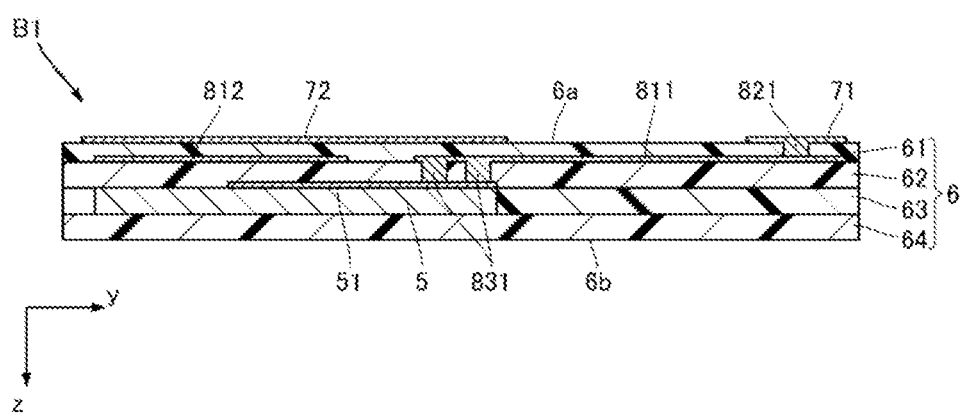
FIG. 16 is a sectional diagram along a section line XVI-XVI in FIG. 13.
Figure 17:
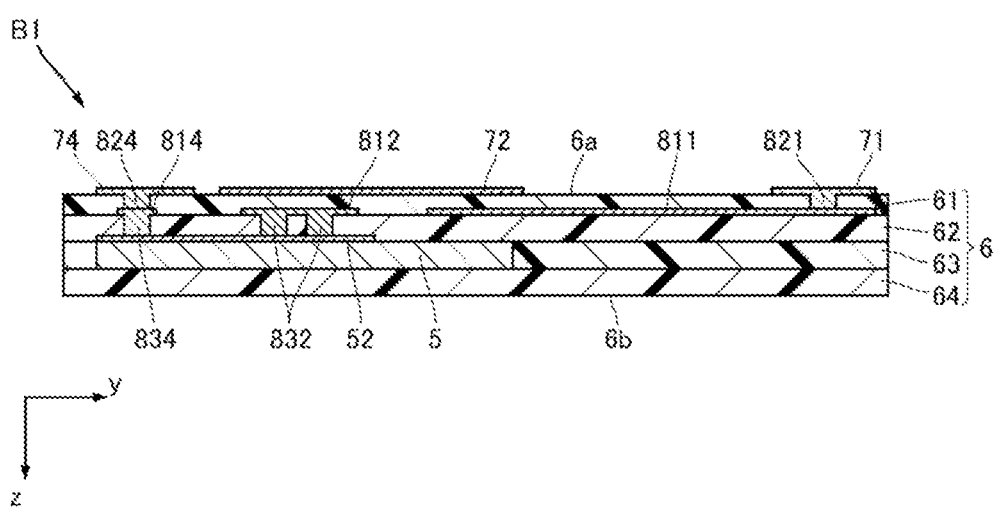
FIG. 17 is a sectional diagram along a section line XVII-XVII in FIG. 13.

FIG. 12 shows a top view of the switching device B1. FIG. 13 shows a bottom view of the switching device B1. FIG. 14 shows a section diagram along a section line XIV-XIV in FIG. 13. FIG. 15 shows a sectional diagram along a section line XV-XV in FIG. 13. FIG. 16 shows a sectional diagram along a section line XVI-XVI in FIG. 13. FIG. 17 shows a sectional diagram along a section line XVII-XVII in FIG. 13.

The switching device B1 does not have specifically defined dimensions; in one example, a dimension in the x direction is approximately 5 mm to 10 mm, a dimension in the y direction is approximately 6 mm to 12 mm, and a dimension in the z direction is approximately 0.4 mm to 1.0 mm.

The semiconductor element 5 is a key element that practices electrical functions of the semiconductor device A1. In this embodiment, the semiconductor element 5 is a high electron mobility transistor (HEMT) including an electron transport layer containing gallium nitride (GaN), wherein the GaN is a type of nitride semiconductor. Moreover, different from this embodiment, the switching device B1 may be formed of a semiconductor element 5.

The semiconductor element 5 does not have a specifically defined shape and appears rectangular from the view along the z direction in this embodiment. The semiconductor element 5 includes a plurality of internal electrodes 51, a plurality of internal electrodes 52 and an internal electrode 53. The plurality of internal electrodes 51, the plurality of internal electrodes 52 and the internal electrode 53 are all arranged on a surface on one side of the semiconductor element 5 in the z direction. A specific configuration example of the plurality of internal electrodes 51, the plurality of internal electrodes 52 and the internal electrode 53 is given for illustration purposes, and is not to be construed as limitations.

The plurality of internal electrodes 51 are drain electrodes. The plurality of internal electrodes 51 appear substantially as trapezoids or triangles extending along in the y direction. The plurality of internal electrodes 52 are arranged equidistantly in the x direction on another end portion of the semiconductor element 5 in the y direction.

The plurality of internal electrodes 52 are source electrodes. The plurality of internal electrodes 52 appear substantially as trapezoids or triangles extending along in the y direction. The plurality of internal electrodes 52 are arranged equidistantly in the x direction on the other end portion of the semiconductor element 5 in the y direction. The plurality of internal electrodes 51 and the plurality of internal electrodes 52 are arranged alternately in the x direction.

The internal electrode 53 is a gate electrode. The internal electrode 53 appears substantially rectangular, and has a dimension less than those of the internal electrodes 51 and the internal electrodes 52 from the view along the z direction. The internal electrode 53 is arranged on another end portion of the semiconductor element 5 in they direction, and is apart from the plurality of internal electrodes 52 in the x direction.

The sealing material 6 includes an insulating material, and covers the entire semiconductor element 5. The sealing material 6 has two surfaces that form a first device surface 6a and a second device surface 6b of the switching device B1. The first device surface 6a and the second device surface 6b are surfaces facing opposite to each other in the z direction, and are flat surfaces in this embodiment.

The sealing material 6 is not defined to be in any specific structure, and in this embodiment, includes a first layer 61, a second layer 62, a third layer 63 and a fourth layer 64. The first layer 61, the second layer 62, the third layer 63 and the fourth layer 64 are, for example, plate materials including glass epoxy. The first layer 61, the second layer 62, the third layer 63 and the fourth layer 64 are layered on one another in the z direction. The first device surface 6a is formed by one surface of the first layer 61. The second device surface 6b is formed by one surface of the fourth layer 64. Moreover, the sealing material 6 is not limited to being a structure including multiple layers of plate materials, and may be, for example, formed integrally by one component.

In this embodiment, an opening is formed at the third layer 63, and the semiconductor element 5 is accommodated in the opening. The plurality of internal electrodes 51, the plurality of internal electrodes 52 and the internal electrode 53 of the semiconductor element 5 are located on the side of the first device surface 6a in the z direction.

The drain electrode 71, the source electrode 72, the gate electrode 73 and the source sensing electrode 74 are configured on the first device surface 6a. The drain electrode 71, the source electrode 72, the gate electrode 73 and the source sensing electrode 74 are not defined to being made of a specific material, and may include metals represented by Cu, Ni, Au and Al, and are for example, formed by means of plating.

The drain electrode 71 is arranged on one end portion of the first device surface 6a close to the y direction. The shape of the drain electrode 71 is not specifically defined, and appears as a long rectangle extending along in the x direction in the example shown in the drawings. The drain electrode 71 is conductively connected to the plurality of internal electrodes 51 in the semiconductor element 5. The drain electrode 71 is located on a position apart from the semiconductor element 5 and the plurality of internal electrodes 51 from the view in the z direction.

The drain electrode 71 is arranged on another end portion of the first device surface 6a close to the y direction. The source electrode 72 is not defined with a specific shape, and in the example shown in the drawings, has two sets of edges extending in the x direction and the y direction, and a recess 721 is formed thereon. The recess 721 is recessed from one side to the other side of the x direction, and is recessed from one side to the other side of the y direction. The source electrode 72 is conductively connected to the plurality of internal electrodes 52 in the semiconductor element 5. An area of source electrode 72 is greater than an area of the drain electrode 71. The source electrode 72 overlaps the plurality of internal electrodes 51 and the plurality of internal electrodes 52 from the view in the z direction.

The gate electrode 73 is arranged on another end portion of the first device surface 6a close to the y direction. In the example shown in the drawings, the gate electrode 73 is located on a position accommodated in the recess 721 of the source electrode 72. The gate electrode 73 appears substantially rectangular from the view in the z direction. The gate electrode 73 is conductively connected to the internal electrode 53 in the semiconductor element 5. The gate electrode 73 overlaps the internal electrode 53 from the view in the z direction.

The source sensing electrode 74 is arranged on another end portion of the first device surface 6a close to the y direction. In the example shown in the drawings, the source sensing electrode 74 is located on a position accommodated in the recess 721 of the source electrode 72, and is arranged between a part of the source electrode 72 and the gate electrode 73 in the x direction. The source sensing electrode 74 appears substantially rectangular from the view in the z direction, and has, for example, a shape and dimensions substantially the same as those of the gate electrode 73. The source sensing electrode 74 is conductively connected to one of the plurality of internal electrodes 52 in the semiconductor element 5. The source sensing electrode 74 overlaps one internal electrode 52 from the view in the z direction.

The intermediate wiring layers 811 to 814 are arranged between the first layer 61 and the second layer 62. The intermediate wiring layers 811 to 814 are not defined to being made of any specific material, and may include metals represented by Cu, Ni, Au and A1, and are for example, formed by means of plating.

The intermediate wiring layer 811 overlaps both the plurality of internal electrodes 51 and the drain electrode 71 from the view in the z direction. In the example shown in the drawings, the intermediate wiring layer 811 appears rectangular.

The intermediate wiring layer 812 overlaps both the plurality of internal electrodes 52 and the source electrode 72 from the view in the z direction. In the example shown in the drawings, the intermediate wiring layer 812 substantially entirely overlaps the three internal electrodes 52 on the left of FIG. 13. Moreover, the intermediate wiring layer 812 partially overlaps the two internal electrodes 52 on the right of FIG. 13. In the example shown in the drawings, the intermediate wiring layer 812 is shaped as including a large rectangular part and a small rectangular part.

The intermediate wiring layer 813 overlaps both the internal electrode 53 and the gate electrode 73 from the view in the z direction. In the example shown in the drawings, the intermediate wiring layer 813 appears substantially rectangular, and is smaller than the internal electrode 53 and the gate electrode 73.

The intermediate wiring layer 814 overlaps both a part of internal electrodes 52 on the right in FIG. 13 among the plurality of internal electrodes 52 and the source sensing electrode 74 from the view in the z direction. In the example shown in the drawings, the intermediate wiring layer 814 appears substantially rectangular, and is smaller than the internal electrode 52 and the source sensing electrode 74.

The connecting portions 821 and 824 individually pass through the first layer 61 in the z direction. The connecting portions 821 to 824 are not defined to being made of any specific material, and may include metals represented by Cu, Ni, Au and A1, and are formed example, formed by means of plating. Moreover, the connecting portions 821 to 824 may also be formed, for example, by the same plating process as the drain electrode 71, the source electrode 72, the gate electrode 73 and the source sensing electrode 74.

The plurality of connecting portions 821 overlap the intermediate wiring layer 811 and the drain electrode 71 from the view in the z direction, and are connected to the intermediate wiring layer 811 and the drain electrode 71. The number or shape of the plurality of connecting portions 821 is not specifically defined. In the example shown in the drawings, the plurality of connecting portions 821 appear cylindrical, and are arranged in the x direction.

The plurality of connecting portions 822 overlap the intermediate wiring layer 812 and the source electrode 72 from the view in the z direction, and are connected to the intermediate wiring layer 812 and the source electrode 72. The number or shape of the plurality of connecting portions 822 is not specifically defined. In the example shown in the drawings, the plurality of connecting portions 822 appear cylindrical, and are arranged in a plurality of columns in the y direction in a manner of overlapping the plurality of internal electrodes 52.

The connecting portion 823 overlaps the intermediate wiring layer 813 and the gate electrode 73 from the view in the z direction, and is connected to the intermediate wiring layer 813 and the gate electrode 73. The number or shape of the connecting portion 823 is not specifically defined. In the examples shown in the drawings, the connecting portion 823 is one in number, and appears cylindrical.

The connecting portion 824 overlaps the intermediate wiring layer 814 and the source sensing electrode 74 from the view in the z direction, and is connected to the intermediate wiring layer 814 and the source sensing electrode 74. The number or shape of the connecting portion 824 is not specifically defined. In the examples shown in the drawings, the connecting portion 824 is one in number, and appears cylindrical.

The connecting portions 831 and 834 individually pass through the second layer 62 in the z direction. The connecting portions 831 to 834 are not defined to being made of any specific material, and may include metals represented by Cu, Ni, Au and A1, and are for example, formed by means of plating. Moreover, the connecting portions 831 to 834 may also be formed, for example, by the same plating process as the intermediate wiring layers 811 to 814.

The plurality of connecting portions 831 overlap the intermediate wiring layer 811 and the plurality of internal electrodes 51 from the view in the z direction, and are connected to the intermediate wiring layer 811 and the plurality of internal electrodes 51. The number or shape of the plurality of connecting portions 831 is not specifically defined. In the example shown in the drawings, the plurality of connecting portions 831 appear cylindrical, and are arranged in a plurality of columns in the y direction in a manner of overlapping the plurality of internal electrodes 52.

The plurality of connecting portions 832 overlap the intermediate wiring layer 812 and the plurality of internal electrodes 52 from the view in the z direction, and are connected to the intermediate wiring layer 812 and the plurality of internal electrodes 52. The number or shape of the plurality of connecting portions 832 is not specifically defined. In the example shown in the drawings, the plurality of connecting portions 832 appear cylindrical, and are arranged in a plurality of columns in the y direction in a manner of overlapping the plurality of internal electrodes 52.

The connecting portion 833 overlaps the intermediate wiring layer 813 and the internal electrode 53 from the view in the z direction, and is connected to the intermediate wiring layer 813 and the internal electrode 53. The number or shape of the connecting portion 833 is not specifically defined. In the examples shown in the drawings, the connecting portion 833 is one in number, and appears cylindrical.

The connecting portion 834 overlaps the intermediate wiring layer 814 and the rightmost internal electrode 52 from the view in the z direction, and is connected to the intermediate wiring layer 814 and the rightmost internal electrode 52. The number or shape of the connecting portion 834 is not specifically defined. In the examples shown in the drawings, the connecting portion 834 is one in number, and appears cylindrical.

[First Lead 1]

The first lead 1 is a component that supports the switching device B1 and forms a conducting path to the switching device B1, and is formed by, for example, cutting and bending a metal plate material such as Cu or a Cu alloy. Moreover, a metal layer containing a metal represented by Ag, Ni, Pd and Au may be provided at an appropriate position of the first lead 1. The metal layer is formed by, for example, plating. As shown in FIG. 1 to FIG. 6 and FIG. 9 to FIG. 11, the first lead 1 of this embodiment has a first main surface 11, a first back surface 12, a first middle surface 13, a first thick portion 14 and a first thin portion 15.

The first main surface 11 is a surface facing the switching device B1 in the z direction. On the first main surface 11, the drain electrode 71 of the switching device B1 is bonded by a conductive bonding material 791. The conductive bonding material 791 is, for example, solder, Ag paste or sintered Ag. The first back surface 12 is a surface facing one side opposite to the first main surface 11 in the z direction. The first main surface 11 and the first back surface 12 are flat surfaces. The first back surface 12 is smaller than the first main surface 11 from the view in the z direction. Moreover, the first back surface 12 is located inside relative to an outer edge of the resin portion 9 from the view in the z direction. The first middle surface 13 is located between the first main surface 11 and the first back surface 12 in the z direction, and faces the same side as the first back surface 12.

The first thick portion 14 is a part overlapping the first main surface 11 and the first back surface 12 from the view in the z direction. The first thick portion 14 is not defined with a specific shape, and in the example shown in the drawings, includes a part appearing rectangular from the view in the z direction, and a wide rectangular part adjacent to the rectangular part in the y direction and having a larger dimension in the x direction.

The first thin portion 15 is a part overlapping the first main surface 11 and the first middle surface 13 from the view in the z direction. The first thin portion 15 is a part having a thickness less than that of the first thick portion 14. That is to say, the first thick portion 14 is a part having a thickness more than that of the first thin portion 15. The first thin portion 15 is not defined with a specific shape, and in the example shown in the drawings, has an edge portion 151 and two extending portion 152.

The edge portion 151 has a part extending from a side end portion of the first thick portion 14 in the y direction, and parts extending from two sides of the first thick portion 14 toward the x direction. The edge portion 151 has two end surfaces 1511 and an end surface 1512. The end surfaces 1511 are end surfaces facing the x direction. The end surface 1512 is an end surface facing the y direction. The two end surfaces 1511 are connected to the end surface 1512. The two end surfaces 1511 and the end surface 1512 are exposed from the resin portion 9.

The two extending portions 152 extend from the end portion on another side of the first thick portion 14 in they direction toward two sides of the x direction. Each of two extending portions 152 has an end surface 1521. The end surfaces 1521 are end surfaces facing the x direction. The two end surfaces 1521 are exposed from the resin portion 9.

In the example shown in the drawings, the drain electrode 71 is arranged on a position at an end portion on one side end portion of the first main surface 11 close to the y direction. Moreover, the drain electrode 71 is located between the edge portion 151 and the two extending portions 152 in the y direction.

[Second Lead 2]

The second lead 2 is a component that supports the switching device B1 and forms a conducting path to the switching device B1, and is formed by, for example, cutting and bending a metal plate material such as Cu or a Cu alloy. Moreover, a metal layer containing a metal represented by Ag, Ni, Pd and Au may be provided at an appropriate position of the second lead 2. The metal layer is formed by, for example, plating. As shown in FIG. 1 to FIG. 3 and FIG. 7 to FIG. 11, the second lead 2 of this embodiment has a second main surface 21, a second back surface 22, a second middle surface 23, a second thick portion 24 and a second thin portion 25. The second lead 2 is arranged on another side in they direction relative to the first lead 1.

The second main surface 21 is a surface facing the switching device B1 in the z direction. On the second main surface 21, the source electrode 72 of the switching device B1 is bonded by a conductive bonding material 792. The conductive bonding material 792 is, for example, solder, Ag paste or sintered Ag. The second back surface 22 is a surface facing one side opposite to the second main surface 21 in the z direction. The second main surface 21 and the second back surface 22 are flat surfaces. The second back surface 22 is smaller than the second main surface 21 from the view in the z direction. Moreover, the second back surface 22 is located inside relative to an outer edge of the resin portion 9 from the view in the z direction. The second middle surface 23 is located between the second main surface 21 and the second back surface 22 in the z direction, and faces the same side as the second back surface 22.

The second thick portion 24 is a part overlapping the second main surface 21 and the second back surface 22 from the view in the z direction. The second thick portion 24 is not defined with a specific shape, and appears rectangular in from the view along the z direction in the example shown in the drawings.

The second thin portion 25 is a part overlapping the second main surface 21 and the second middle surface 23 from the view in the z direction. The second thin portion 25 is a part having a thickness less than that of the second thick portion 24. That is to say, the second thick portion 24 is a part having a thickness more than that of the second thin portion 25. The second thin portion 25 is not defined with a specific shape, and in the example shown in the drawings, has an edge portion 251 and cross section portion 252.

The edge portion 251 is a part encircling the second thick portion 24 from the view in the z direction, and appears ring-shaped. The edge portion 251 has an end surface 2511. The end surface 2511 is an end surface facing the y direction. The end surface 2511 is exposed from the resin portion 9.

The cross section portion 252 is a part connected on one side in the y direction relative to the edge portion 251. The cross section portion 252 appears as a long rectangle extending along in the x direction. The cross section portion 252 has two end surfaces 2521. The two end surfaces 2521 are end surfaces facing the x direction. The two end surfaces 2521 are exposed from the resin portion 9.

In the example shown in the drawings, the source electrode 72 is configured such that the recess 721 of the source electrode 72 is arranged along a corner formed by the edge portion 251 and a border of the cross section portion 252 from the view in the z direction. Moreover, from the view in the z direction, most part of the source electrode 72 overlaps the second thin portion 25, and another part overlaps the second thick portion 24.

[Third Lead 3]

The third lead 3 is a component that supports the switching device B1 and forms a conducting path to the switching device B1, and is formed by, for example, cutting and bending a metal plate material such as Cu or a Cu alloy. Moreover, a metal layer containing a metal represented by Ag, Ni, Pd and Au may be provided at an appropriate position of the third lead 3. The metal layer is formed by, for example, plating. As shown in FIG. 1 to FIG. 3, FIG. 8 and FIG. 9, the third lead 3 of this embodiment has a third main surface 31, a third back surface 32, a third middle surface 33, a third thick portion 34 and a third thin portion 35. The third lead 3 is arranged on another side in the y direction relative to the cross section portion 252 of the second lead 2, and is arranged on one side in the x direction relative to the edge portion 251.

The third main surface 31 is a surface facing the switching device B1 in the z direction. On the third main surface 31, the gate electrode 73 of the switching device B1 is bonded by a conductive bonding material 793. The conductive bonding material 793 is, for example, solder, Ag paste or sintered Ag. The third back surface 32 is a surface facing one side opposite to the third main surface 31 in the z direction. The third main surface 31 and the third back surface 32 are flat surfaces. The third back surface 32 is smaller than the third main surface 31 from the view in the z direction. Moreover, the third back surface 32 is located inside relative to an outer edge of the resin portion 9 from the view in the z direction. The third middle surface 33 is located between the third main surface 31 and the third back surface 32 in the z direction, and faces the same side as the third back surface 32. In the example shown in the drawings, the third main surface 31 and the third back surface 32 both appear rectangular. In the example shown in the drawings, the gate electrode 73 is arranged along a corner where the side end portion of another side in the x direction and the side end portion of another side in the y direction of the main surface 31 are connected.

The third thick portion 34 is a part overlapping the third main surface 31 and the third back surface 32 from the view in the z direction. The third thick portion 34 does not have a specifically defined shape, and appears rectangular from the view along the z direction in the example shown in the drawings.

The third thin portion 35 is a part overlapping the third main surface 31 and the third middle surface 33 from the view in the z direction. The third thin portion 35 is a part having a thickness less than that of the third thick portion 34. That is to say, the third thick portion 34 is a part having a thickness more than that of the third thin portion 35. The third thin portion 35 does not have a specifically defined shape, and appears as a rectangular ring-shape surrounding the third thick portion 34 from the view along the z direction in the example shown in the drawings. The third thin portion 35 has an end surface 351. The end surface 351 is an end surface facing the y direction. The end surface 351 is exposed from the resin portion 9.

[Fourth Lead 4]

The fourth lead 4 is a component that supports the switching device B1 and forms a conducting path to the switching device B1, and is formed by, for example, cutting and bending a metal plate material such as Cu or a Cu alloy. Moreover, a metal layer containing a metal represented by Ag, Ni, Pd and Au may be provided at an appropriate position of the fourth lead 4. The metal layer is formed by, for example, plating. As shown in FIG. 1 to FIG. 3, FIG. 8 and FIG. 10, the fourth lead 4 of this embodiment has a fourth main surface 41, a fourth back surface 42, a fourth middle surface 43, a fourth thick portion 44 and a fourth thin portion 45. The fourth lead 4 is arranged on another side of the y direction relative to the cross section portion 252 of the second lead 2, and is arranged between the edge portion 251 and the third lead 3 in the x direction.

The fourth main surface 41 is a surface facing the switching device B1 in the z direction. On the fourth main surface 41, the source sensing electrode 74 of the switching device B1 is bonded by a conductive bonding material 794. The conductive bonding material 794 is, for example, solder, Ag paste or sintered Ag. The fourth back surface 42 is a surface facing one side opposite to the fourth main surface 41 in the z direction. The fourth main surface 41 and the fourth back surface 42 are flat surfaces. The fourth back surface 42 is smaller than the fourth main surface 41 from the view in the z direction. Moreover, the fourth back surface 42 is located inside relative to an outer edge of the resin portion 9 from the view in the z direction. The fourth middle surface 43 is located between the fourth main surface 41 and the fourth back surface 42 in the z direction, and faces the same side as the fourth back surface 42. In the example shown in the drawings, the fourth main surface 41 and the fourth back surface 42 both appear rectangular. In the example shown in the drawings, the source sensing electrode 74 is arranged one another side of the y direction relative to the center of the fourth main surface 41.

The fourth thick portion 44 is a part overlapping the fourth main surface 41 and the fourth back surface 42 from the view in the z direction. The fourth thick portion 44 does not have a specifically defined shape, and appears rectangular from the view along the z direction in the example shown in the drawings.

The fourth thin portion 45 is a part overlapping the fourth main surface 41 and the fourth middle surface 43 from the view in the z direction. The fourth thin portion 45 is a part having a thickness less than that of the fourth thick portion 44. That is to say, the fourth thick portion 44 is a part having a thickness more than that of the fourth thin portion 45. The fourth thin portion 45 does not have a specifically defined shape, and extends from the third thick portion 34 toward two sides of the y direction in from the view along the z direction in the example shown in the drawings. The fourth thin portion 45 has an end surface 451. The end surface 451 is an end surface facing the y direction. The end surface 451 is exposed from the resin portion 9.

As shown in FIG. 3, in this embodiment, a dimension y11 of the edge portion 151 in the y direction is greater than a dimension y12 of the extending portion 152 in the y direction. Moreover, a distance between the edge portion 151 and the extending portion 152 in the y direction, that is, a dimension y13, is greater than either of the dimension y11 and the dimension y12. A dimension y2 of the cross section portion 252 is greater than either of the dimension y11 and the dimension y12. A distance between the first lead 1 and the second lead 2 in they direction, that is, a dimension g1, is less than any of the dimension y11, the dimension y12 and the dimension y2.

[Resin Portion 9]

The resin portion 9 covers a portion of each of the first lead 1, the second lead 2, the third lead 3 and the fourth lead 4, and the switching device B1. The resin layer 9 includes an insulative resin. Moreover, in this embodiment, the resin portion 9 includes a material having a water permeability less than that of the sealing material 6 of the switching device B1. The resin portion 9 is made of, for example, black epoxy resin containing a filler. As shown in FIG. 1 to FIG. 11, the resin portion 9 of this embodiment has a first resin surface 91, a second resin surface 92, two third resin surfaces 93 and two fourth resin surfaces 94.

The first resin surface 91 is a surface facing the same side as the switching device B1 in the z direction. The first resin surface 91 is a flat surface. In this embodiment, the first back surface 12, the second back surface 22, the third back surface 32 and the fourth back surface 42 are exposed from the first resin surface 91. The first resin surface 91 are coplanar with first back surface 12, the second back surface 22, the third back surface 32 and the fourth back surface 42. However, when a metal layer formed by means such as plating is provided on the first back surface 12, the second back surface 22, the third back surface 32 and the fourth back surface 42, the metal layer sometimes slightly protrudes from the first resin surface 91.

The second resin surface 92 is a surface facing one side opposite to the first resin surface 91 in the z direction. The second resin surface 92 appear rectangular from the view in the z direction, and is, for example, a flat surface.

The two third resin surfaces 93 are surfaces facing two sides of the x direction. Each third resin surface 93 may be a flat surface, or may be a curved surface of which a part near the center in the z direction slightly protrudes from an outer side of the x direction. In this embodiment, the end surface 1511, the end surface 1521 and the end surface 2521 are exposed from the third resin surface 93. The third resin surface 93 are coplanar with the end surface 1511, the end surface 1521 and the end surface 2521.

The two fourth resin surfaces 94 are surfaces facing two sides of the y direction. The fourth resin surface 94 may be a flat surface, or may be a curved surface of which a part near the center in the z direction slightly protrudes from an outer side of the y direction. In this embodiment, the end surface 1512 is exposed from one fourth resin surface 94. The fourth resin surfaces 94 are coplanar with the end surface 1512. Moreover, the end surface 2511, the end surface 351 and the end surface 451 are exposed from another fourth resin surface 94. The fourth resin surfaces 94 are coplanar with the end surface 2511, the end surface 351 and the end surface 451.

As shown in FIG. 3, in this embodiment, a center O1 (coinciding with the center of the resin portion 9) of the semiconductor device A1 is apart from a center O2 of the switching device B1 from the view in the z direction. The center O2 is located on another side of the x direction relative to the center O1. Moreover, the center O2 is located on one side of the y direction relative to the center O1. A distance dx between the center O1 and the center O2 in the x direction is, for example, greater than a dimension of the fourth lead 4 in the x direction. Moreover, a distance dy between the center O1 and the center O2 in the y direction is, for example, greater than the dimension y12 or the dimension g1.

Next, the effects of the semiconductor device A1 are described below.

In the switching device B1 according to this embodiment, the first device surface 6a is provided with the drain electrode 71, the source electrode 72 and the gate electrode 73. The drain electrode 71, the source electrode 72 and the gate electrode 73 are conductively connected to the first lead 1, the second lead 2 and the third lead 3 via the conductive bonding materials 791, 792 and 793. Thus, other leads do not need to be provided on one side of the sealing material 6 to which the second device surface 6b faces. Moreover, leads connected to the drain electrode 71, the source electrode 72 and the gate electrode 73 are not needed. Thus, thinning of the semiconductor device A1 can be achieved.

The switching device B1 includes the semiconductor element 5, which includes a GaN-high electron mobility transistor (GaN-HEMT). Thus, the switching device B1 (the semiconductor device A1) can be driven at a high frequency. In addition, compared to a Si-containing switching device, a high output can be achieved.

The switching device B1 further includes the source sensing electrode 74 arranged on the first device surface 6a. The source sensing electrode 74 is conductively connected to the fourth lead 4 via the conductive bonding materials and 794. Thus, without hindering thinning of the semiconductor device A1, the semiconductor device A1 can be more finely controlled.

As shown in FIG. 2, the second back surface 22, the third back surface 32 and the fourth back surface 42 are arranged side by side in the x direction. Moreover, the first main surface 11 is arranged away from the second back surface 22, the third back surface 32 and the fourth back surface 42 are arranged in the y direction. Thus, by mounting the semiconductor device A1 to a circuit substrate (omitted from the drawings) by soldering, unnecessary rotation or offsets of the semiconductor device A1 can be mitigated. Moreover, the fourth back surface 42 is arranged between the second back surface 22 and the third back surface 32 in the x direction, and has a dimension in the x direction less than those of the second back surface 22 and the third back surface 32. Accordingly, the semiconductor device A1 can be designed as a structure having the fourth back surface 42 conductively connected to the source sensing electrode 74, and a dimension of the semiconductor device A1 in the x direction can be inhibited from increasing.

The first thin portion 15 of the first lead 1 includes the edge portion 151 and two extending portions 152. Accordingly, the first lead 1 is inhibited from falling off the sealing material 6. In addition, with the two extending portions 152 provided, a more stable mounting process for mounting the switching device B1 to the first lead 1 during the manufacture of the semiconductor device A1 can be performed.

The cross section portion 252 of the second lead 2 is connected to most part of the source electrode 72 of the switching device B1. The cross section portion 252 is a part away from the second back surface 22, and is hence a part for which support from underneath can be quite difficult during mounting of the switching device B1. However, the cross section portion 252 of this embodiment crosses the second lead 2 in the x direction. Thus, two ends of the cross section 252 can be supported from outer sides that become a region of the semiconductor device A1, thereby enabling a more stable mounting process.

From the view in the z direction, a part of the source electrode 72 overlaps the second back surface 22 (the second thick portion 24). This is preferred for performing the mounting process of the switching device B1.

A gap between the first lead 1 and the second lead 2, that is, the dimension g1, is less than any of the dimensions y11, y12 and y2. Accordingly, the distance between the first lead 1 and the second lead 2 can be reduced, and this is preferred for miniaturization of the semiconductor device A1.

The resin portion 9 includes a material having a water permeability less than that of the sealing material 6 of the switching device B1. Accordingly, moisture seeping from outside the semiconductor device B1 can be mitigated, thereby more reliably protecting the semiconductor element 5 of the switching device B1.

Figure 18:
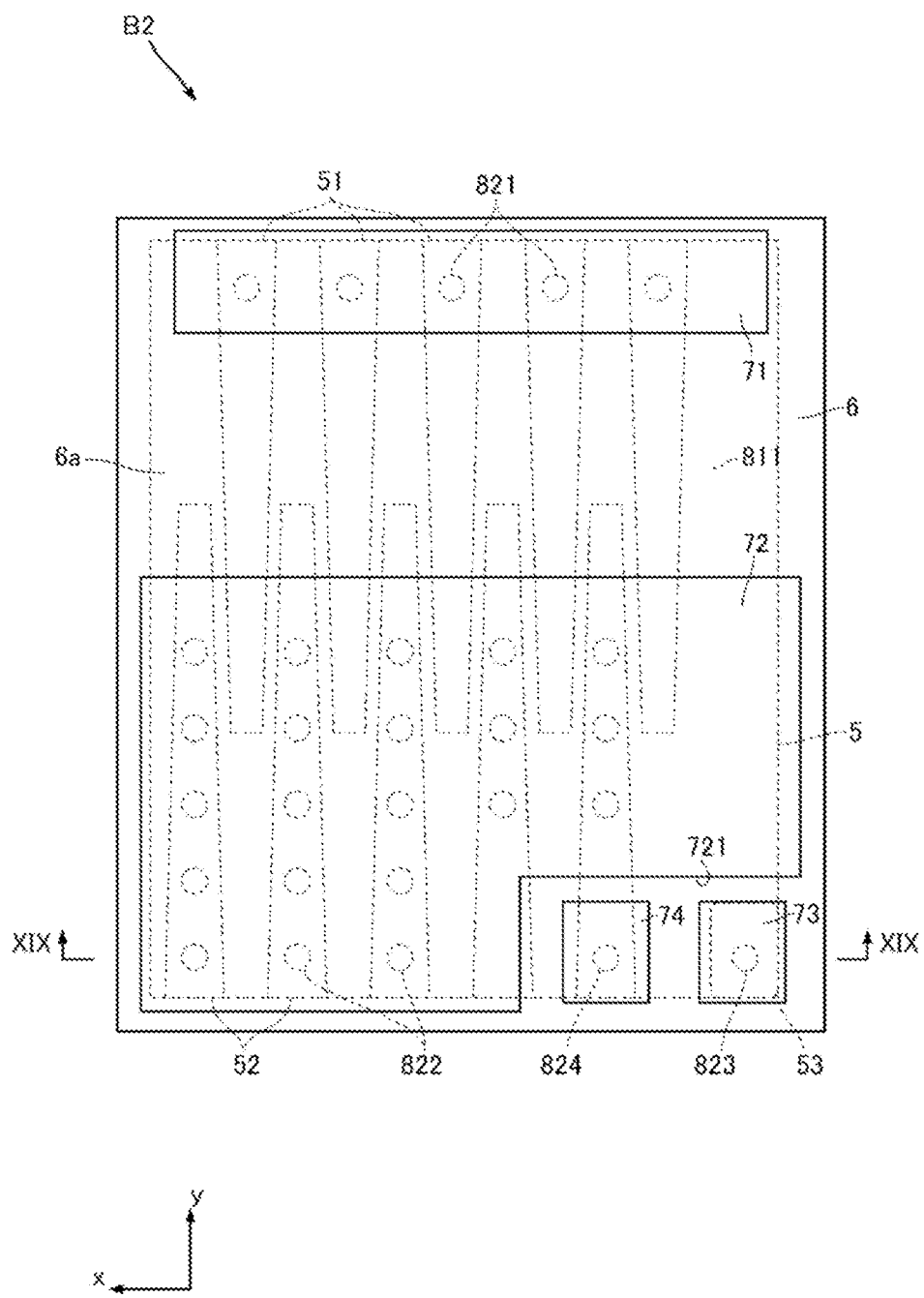
FIG. 18 is a bottom view of a switching device of a semiconductor device according to a second embodiment of the present disclosure.
Figure 19:
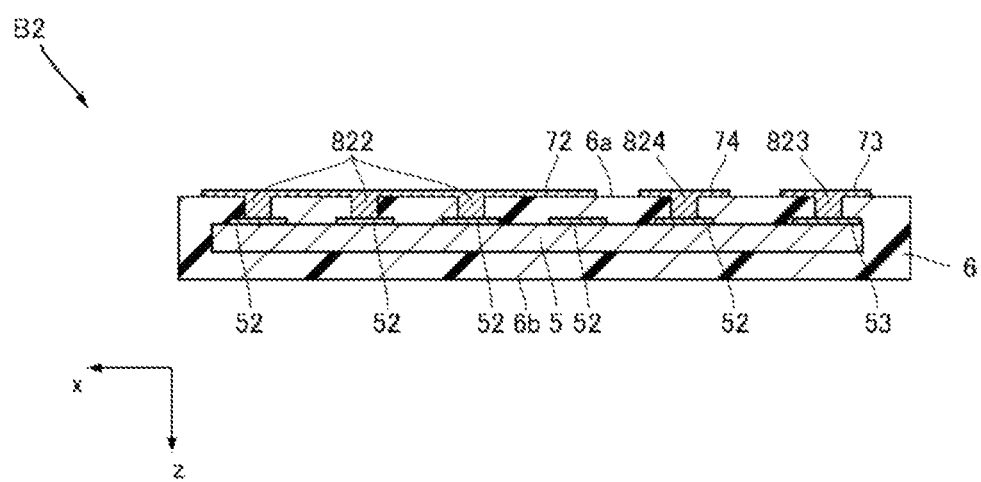
FIG. 19 is a sectional diagram along a section line XIX-XIX in FIG. 18.

FIG. 18 and FIG. 19 show other embodiments of the present disclosure. Moreover, in these drawings, elements that are the same or similar to those of the embodiment above are assigned with the same denotations or numerals.

(Switching Device B2)

FIG. 18 and FIG. 19 show a switching device used by a semiconductor device according to a second embodiment of the present disclosure. In this embodiment, the switching device B2 has an overall shape and dimensions, and the drain electrode 71, the source electrode 72, the gate electrode 73 and the source sensing electrode 74 have shapes, dimensions and configurations the same as those of the switching device B1.

From the view in the z direction, the semiconductor element 5 of the switching device B2 overlaps the drain electrode 71, the source electrode 72, the gate electrode 73 and the source sensing electrode 74. That is to say, a dimension of the semiconductor element 5 of the switching device B2 in the y direction is greater than that of the semiconductor element 5 of the switching device B1. Moreover, the gate electrode 71 overlaps the plurality of internal electrodes 51 from the view in the z direction.

The drain electrode 71 is connected to the plurality of internal electrodes 51 via the plurality of connecting portions 821. The source electrode 72 is connected to the plurality of internal electrodes 52 via the plurality of connecting portions 822. The source sensing electrode 74 is connected to one internal electrode 52 via the connecting portion 824. As such, the switching device B2 does not include the intermediate wiring layers 811 to 814 or the connecting portions 831 to 834 as those in the switching device B1.

The sealing material 6 of this embodiment may be a structure in which a plurality of plate materials are layered as the sealing material 6 of the switching device B1, or may be a structure formed integrally. In this embodiment, the material of the resin portion 9 has a water permeability less than that of the sealing material 6.

In this embodiment, a ratio of outer dimensions of the sealing material 6 to outer dimensions of the switching device B2 is greater than a ratio of those of the switching device B1. Thus, the volume of the semiconductor element 5 occupies a higher ratio in the volume of the overall switching device B2, and the volume of the sealing material 6 occupies a lower ratio.

According to this embodiment, thinning can similarly be achieved to practice the same effects as the semiconductor device A1. Moreover, according to this embodiment, it can be understood that the specific structure of the switching device of the present disclosure can be implemented by various structures based on the switching devices B1 and B2. For example, the semiconductor element 5 excluding the sealing material 6, the intermediate wiring layer 811 to the intermediate wiring layer 814 and the connecting portions 821 to 834 can be used as the switching device of the present disclosure. In this case, the drain electrode 71 is formed by the internal electrode 51, the source electrode 72 is formed by any one of the plurality of internal electrodes 52, the gate electrode 73 is formed by the internal electrode 53, and the source sensing electrode 74 is formed by any one of the plurality of internal electrodes 52.

The semiconductor device of the present disclosure is not limited to the embodiments described above. Various design modifications may be made as desired to the specific structures of the components of the semiconductor device of the present disclosure.

[Note 1]

A semiconductor device, comprising: a switching device, having a first device surface and a second device surface facing opposite to each other in a thickness direction, and a drain electrode, a source electrode and a gate electrode that are arranged on the first device surface;

a first lead, conductively connected to the drain electrode;

a second lead, conductively connected to the source electrode;

a third lead, conductively connected to the gate electrode; and a resin portion, covering the switching device and a portion of each of the first to the third leads, and having a first resin surface facing a same side as the first device surface and a second resin surface facing a same side as the second device surface, wherein the first to the third leads are exposed from the first resin surface.

[Note 2]

The semiconductor device according to note 1, wherein the switching device includes a high electron mobility transistor (GaN-HEMT).

[Note 3]

The semiconductor device according to note 1, wherein the switching device includes a source sensing electrode disposed on the first device surface, the semiconductor device further includes a fourth lead conductively connected to the source sensing electrode, and the fourth lead is exposed from the first resin surface.

[Note 4]

The semiconductor device according to note 3, wherein the first to the fourth leads overlap with the resin portion from a view along the thickness direction.

[Note 5]

The semiconductor device according to note 4, wherein the first lead has a first main surface facing the switching device in the thickness direction and a first back surface facing an opposite side to the first main surface, the first back surface is exposed from the first resin surface, the second lead has a second main surface facing the switching device in the thickness direction and a second back surface facing an opposite side to the second main surface, the second back surface is exposed from the first resin surface, the third lead has a third main surface facing the switching device in the thickness direction and a third back surface facing an opposite side to the third main surface, the third back surface is exposed from the first resin surface, the fourth lead has a fourth main surface facing the switching device in the thickness direction and a fourth back surface facing an opposite side to the fourth main surface, and the fourth back surface is exposed from the first resin surface the second back surface is exposed from the first resin surface.

[Note 6]

The semiconductor device according to note 5, wherein the first lead and the second lead are arranged apart from each other in a first direction orthogonal to the thickness direction.

[Note 7]

The semiconductor device according to note 6, wherein a dimension of the drain electrode in the first direction is less than a dimension of the source electrode in the first direction, and a dimension of the first main surface in the first direction is greater than a dimension of the second main surface in the first direction.

[Note 8]

The semiconductor device according to note 7, wherein the first lead has a first middle surface located between the first main surface and the first back surface in the thickness direction, the first lead has a first thick portion and a first thin portion, the first thick portion overlaps the first main surface and the first back surface from the view along the thickness direction, and the first thin portion overlaps the first main surface and the first middle surface.

[Note 9]

The semiconductor device according to note 8, wherein the drain electrode overlaps the first thick portion from the view along the thickness direction.

[Note 10]

The semiconductor device according to note 9, wherein the first thin portion includes:

an extending portion, extending from the first thick portion in the thickness direction and a second direction orthogonal to the first direction; and a first edge portion, located on an opposite side to the second lead in the first direction with respect to the extending portion.

[Note 11]

The semiconductor device according to note 10, wherein a dimension of the extending portion in the first direction is less than a dimension of the first edge portion in the first direction.

[Note 12]

The semiconductor device according to note 11, wherein a distance between the first lead and the second lead in the first direction is less than the dimension of the extending portion of the first thin portion in the first direction.

[Note 13]

The semiconductor device according to any one of notes 10 to 12, wherein the second lead has a second middle surface located between the second main surface and the second back surface in the thickness direction, the second lead has a second thick portion and a second thin portion, the second thick portion overlaps the second main surface and the second back surface when viewed in the thickness direction, and the second thin portion overlaps the second main surface and the second middle surface.

[Note 14]

The semiconductor device according to note 13, wherein the second thin portion includes:

a cross section portion, reaching both ends of the resin portion in the second direction, and located on a side of the first lead with respect to the second thick portion in the first direction; and a second edge portion, extending from the second thick portion.

[Note 15]

The semiconductor device according to note 14, wherein the source electrode overlaps the cross section portion from the view along the thickness direction.

[Note 16]

The semiconductor device according to note 15, wherein a dimension of the cross section portion in the first direction is greater than a dimension of the extending portion of the first thin portion of the first lead in the first direction.

[Note 17]

The semiconductor device according to any one of notes 13 to 16, wherein the second back surface, the third back surface, and the fourth back surface are arranged side by side in the second direction.

The invention claimed is:

1. A semiconductor device, comprising:
a switching device, having a first device surface and a second device surface facing opposite to each other in a thickness direction, and a drain electrode, a source electrode and a gate electrode that are arranged on the first device surface;
a first lead, conductively connected to the drain electrode;
a second lead, conductively connected to the source electrode;
a third lead, conductively connected to the gate electrode; and
a resin portion, covering the switching device and a portion of each of the first to the third leads, and having a first resin surface facing a same side as the first device surface and a second resin surface facing a same side as the second device surface,
wherein the first to the third leads are exposed from the first resin surface,
wherein the first lead has a first main surface facing the switching device in the thickness direction and a first back surface facing an opposite side to the first main surface, the first back surface is exposed from the first resin surface, the second lead has a second main surface facing the switching device in the thickness direction and a second back surface facing an opposite side to the second main surface, the second back surface is exposed from the first resin surface, the third lead has a third main surface facing the switching device in the thickness direction and a third back surface facing an opposite side to the third main surface, the third back surface is exposed from the first resin surface, a fourth lead has a fourth main surface facing the switching device in the thickness direction and a fourth back surface facing an opposite side to the fourth main surface, and the fourth back surface is exposed from the first resin surface,
wherein the first lead and the second lead are arranged apart from each other in a first direction orthogonal to the thickness direction, and
wherein a dimension of the drain electrode in the first direction is less than a dimension of the source electrode in the first direction, and a dimension of the first main surface in the first direction is greater than a dimension of the second main surface in the first direction.

2. The semiconductor device of claim 1, wherein the switching device includes a high electron mobility transistor.

3. The semiconductor device of claim 1, wherein the switching device includes a source sensing electrode disposed on the first device surface, the semiconductor device further includes the fourth lead conductively connected to the source sensing electrode.

4. The semiconductor device of claim 3, wherein the first to the fourth leads overlap with the resin portion from a view along the thickness direction.

5. The semiconductor device of claim 1, wherein
the first lead has a first middle surface located between the first main surface and the first back surface in the thickness direction,
the first lead has a first thick portion and a first thin portion,
the first thick portion overlaps the first main surface and the first back surface from a view along the thickness direction, and
the first thin portion overlaps the first main surface and the first middle surface.

6. The semiconductor device of claim 5, wherein the drain electrode overlaps the first thick portion from the view along the thickness direction.

7. The semiconductor device of claim 6, wherein the first thin portion includes:
an extending portion, extending from the first thick portion in the thickness direction and a second direction orthogonal to the first direction; and
a first edge portion, located on an opposite side to the second lead in the first direction with respect to the extending portion.

8. The semiconductor device of claim 7, wherein a dimension of the extending portion in the first direction is less than a dimension of the first edge portion in the first direction.

9. The semiconductor device of claim 8, wherein a distance between the first lead and the second lead in the first direction is less than the dimension of the extending portion of the first thin portion in the first direction.

10. The semiconductor device of claim 7, wherein
the second lead has a second middle surface located between the second main surface and the second back surface in the thickness direction,
the second lead has a second thick portion and a second thin portion,
the second thick portion overlaps the second main surface and the second back surface when viewed in the thickness direction, and
the second thin portion overlaps the second main surface and the second middle surface.

11. The semiconductor device of claim 10, wherein the second thin portion includes:
a cross section portion, reaching both ends of the resin portion in the second direction, and located on a side of the first lead with respect to the second thick portion in the first direction; and
a second edge portion, extending from the second thick portion.

12. The semiconductor device of claim 11, wherein the source electrode overlaps the cross section portion from the view along the thickness direction.

13. The semiconductor device of claim 12, wherein a dimension of the cross section portion in the first direction is greater than a dimension of the extending portion of the first thin portion of the first lead in the first direction.

14. The semiconductor device of claim 10, wherein the second back surface, the third back surface, and the fourth back surface are arranged side by side in the second direction.

15. A semiconductor device, comprising:
a switching device, having a first device surface and a second device surface facing opposite to each other in a thickness direction, and a drain electrode, a source electrode and a gate electrode that are arranged on the first device surface;
a first lead, conductively connected to the drain electrode;
a second lead, conductively connected to the source electrode;
a third lead, conductively connected to the gate electrode; and
a resin portion, covering the switching device and a portion of each of the first to the third leads, and having a first resin surface facing a same side as the first device surface and a second resin surface facing a same side as the second device surface,
wherein the first to the third leads are exposed from the first resin surface,
wherein the switching device includes a source sensing electrode disposed on the first device surface, the semiconductor device further includes a fourth lead conductively connected to the source sensing electrode, and the fourth lead is exposed from the first resin surface,
wherein the first to the fourth leads completely overlap the resin portion from a view along the thickness direction.

16. The semiconductor device of claim 15, wherein
the first lead has a first main surface facing the switching device in the thickness direction and a first back surface facing an opposite side to the first main surface,
the first back surface is exposed from the first resin surface,
the second lead has a second main surface facing the switching device in the thickness direction and a second back surface facing an opposite side to the second main surface,
the second back surface is exposed from the first resin surface,
the third lead has a third main surface facing the switching device in the thickness direction and a third back surface facing an opposite side to the third main surface,
the third back surface is exposed from the first resin surface,
the fourth lead has a fourth main surface facing the switching device in the thickness direction and a fourth back surface facing an opposite side to the fourth main surface, and
the fourth back surface is exposed from the first resin surface.

17. The semiconductor device of claim 16, wherein the first lead and the second lead are arranged apart from each other in a first direction orthogonal to the thickness direction.

18. The semiconductor device of claim 16, wherein
the first lead has a first middle surface located between the first main surface and the first back surface in the thickness direction,
the first lead has a first thick portion and a first thin portion,
the first thick portion overlaps the first main surface and the first back surface from the view along the thickness direction, and
the first thin portion overlaps the first main surface and the first middle surface.

19. The semiconductor device of claim 18, wherein the drain electrode overlaps the first thick portion from the view along the thickness direction.

20. The semiconductor device of claim 18, wherein the first thin portion includes:
an extending portion, extending from the first thick portion in the thickness direction and a second direction orthogonal to the first direction; and a first edge portion, located on an opposite side to the second lead in the first direction with respect to the extending portion.

\* \* \* \* \*